(12) United States Patent
Uchida

(10) Patent No.: US 12,690,205 B2
(45) Date of Patent: Jul. 21, 2026

(54) RESONANT TUNNELING DIODE, OSCILLATOR AND DETECTION SYSTEM

(71) Applicant: CANON KABUSHIKI KAISHA, Tokyo (JP)

(72) Inventor: Tatsuro Uchida, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 569 days.

(21) Appl. No.: 18/156,508

(22) Filed: Jan. 19, 2023

(65) Prior Publication Data

US 2023/0246112 A1    Aug. 3, 2023

(30) Foreign Application Priority Data

Jan. 28, 2022    (JP) ................................ 2022-012278

(51) Int. Cl.
*H10D 8/75*        (2025.01)
*H10D 8/01*        (2025.01)

(52) U.S. Cl.
CPC ............. *H10D 8/755* (2025.01); *H10D 8/053* (2025.01)

(58) Field of Classification Search
None
See application file for complete search history.

(56) References Cited

U.S. PATENT DOCUMENTS

| | | | |
|---|---|---|---|
| 11,011,663 B2 | 5/2021 | Koyama et al. | |
| 2010/0289000 A1 | 11/2010 | Kojima | |

| | | | | |
|---|---|---|---|---|
| 2013/0328635 A1* | 12/2013 | Sekiguchi | ................ | H03B 7/14 |
| | | | | 331/105 |
| 2014/0266477 A1* | 9/2014 | Sekiguchi | ................ | H01Q 1/38 |
| | | | | 331/96 |
| 2016/0218201 A1 | 7/2016 | Okamoto | | |
| 2018/0301490 A1* | 10/2018 | Dofuku | ................ | H10F 39/807 |
| 2020/0111929 A1* | 4/2020 | Koyama | ................ | H10F 30/21 |

FOREIGN PATENT DOCUMENTS

| | | |
|---|---|---|
| JP | 2008-226918 A | 9/2008 |
| JP | 2010-267699 A | 11/2010 |
| JP | 2014-14072 A | 1/2014 |
| JP | 2016-134609 A | 7/2016 |
| JP | 2017-168518 A | 9/2017 |
| JP | 2020-57739 A | 4/2020 |

OTHER PUBLICATIONS

N. Zainal et al., "Current-Voltage Characteristics of Zinc-Blende (cubic) Al0.3Ga0.7N/GaN Double Barrier Resonant Tunneling Diodes", 97(11) Appl. Phys. Lett. 112102-1112102-3 (Sep. 2010).
Extended European Search Report in European Application No. 23153384.5 (Jun. 2023).
Notice of Reasons for Refusal in Japanese Application No. 2022-012278 (Sep. 2025).

* cited by examiner

*Primary Examiner* — Xiaoming Liu
(74) *Attorney, Agent, or Firm* — Venable LLP

(57)        ABSTRACT

A resonant tunneling diode includes a substrate, and a mesa structure including a compound semiconductor layer including a heterojunction comprising a multi-barrier structure disposed on the substrate, and an electrode disposed on the upper surface of the compound semiconductor layer. An outer edge portion of the compound semiconductor layer is a first region including crystal defects, and the first region and the electrode are set apart from each other.

15 Claims, 11 Drawing Sheets

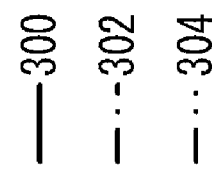
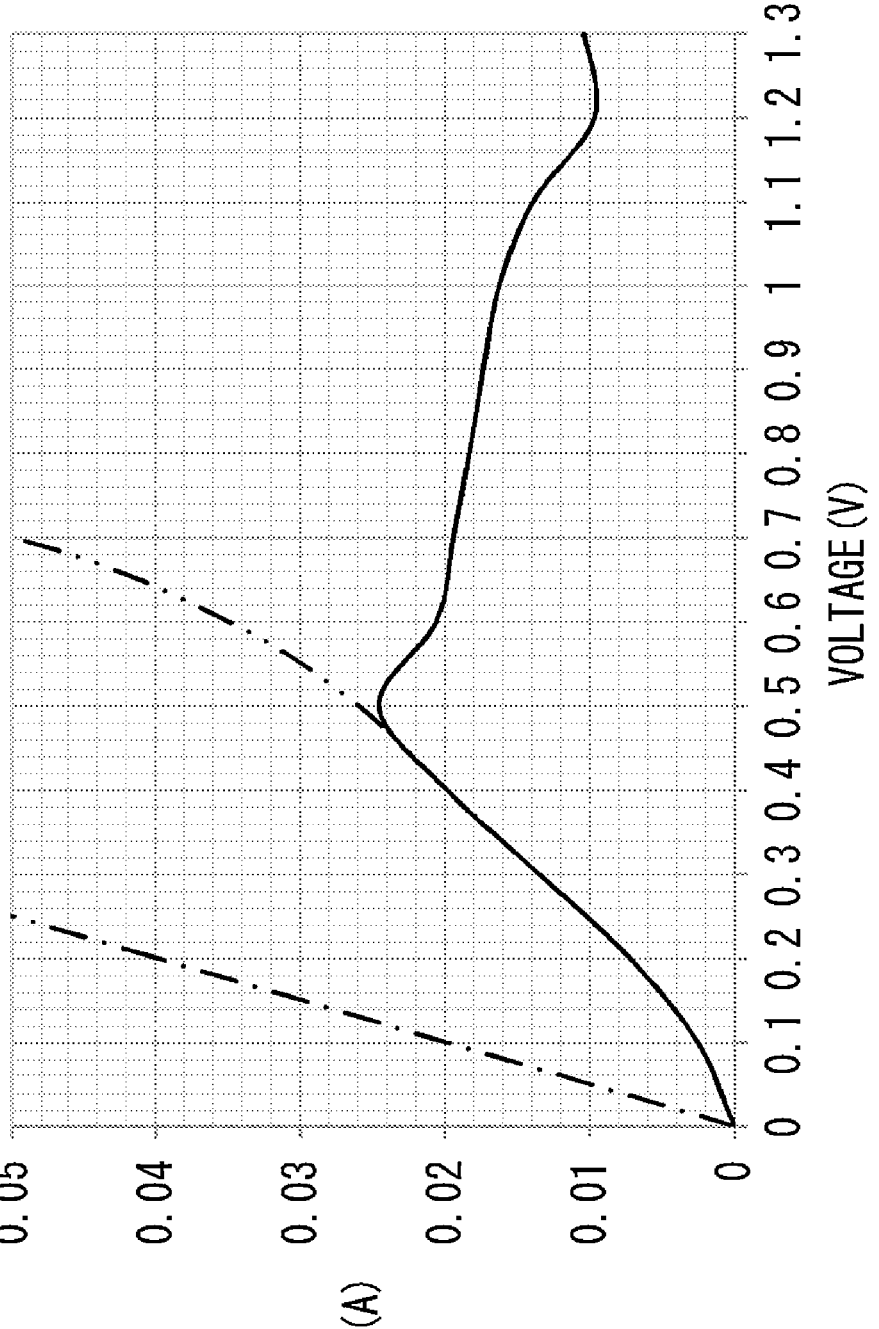
FIG. 3

RESONANT TUNNELING DIODE, OSCILLATOR AND DETECTION SYSTEM

BACKGROUND OF THE INVENTION

Field of the Invention

The technique of the present disclosure relates to a resonant tunneling diode, an oscillator, and a detection system.

Description of the Related Art

Terahertz oscillators in which a resonant tunneling diode (RTDs) and an antenna are integrated are being developed for imaging systems using terahertz waves and large-capacity wireless communication systems.

For example, Japanese Patent Application Publication No. 2020-57739 discloses a terahertz oscillator using a single solid-state device in which a patch antenna is integrated with an RTD.

SUMMARY OF THE INVENTION

In view of the above, the technique of the present disclosure aims to provide a resonant tunneling diode that operates stably without short-circuiting in the characteristics of the resonant tunneling diode when a current is applied.

According to an aspect of the present disclosure, it is provided a resonant tunneling diode including a substrate, and a mesa structure including a compound semiconductor layer including a heterojunction comprising a multi-barrier structure disposed on the substrate, and an electrode disposed on the upper surface of the compound semiconductor layer, wherein an outer edge portion of the compound semiconductor layer is a first region including crystal defects, and the first region and the electrode are set apart from each other.

According to an aspect of the present disclosure, it is provided an oscillator including one or a plurality of above resonant tunneling diodes, wherein one or the plurality of resonant tunneling diodes are connected to and integrated with an antenna to form a single solid-state element structure.

According to an aspect of the present disclosure, it is provided an oscillator, including a plurality of above oscillators, wherein the plurality of oscillators are coupled and operate in synchronization with each other.

According to an aspect of the present disclosure, it is provided a detection system including the above resonant tunneling diode as an oscillation element, a receiving element that receives a high frequency from the oscillation element, and a processing circuit that processes a signal from the receiving element.

Further features of the present invention will become apparent from the following description of exemplary embodiments with reference to the attached drawings.

BRIEF DESCRIPTION OF THE DRAWINGS

FIG. 3 explains the characteristics of the RTD according to Embodiment 1;

FIG. 5 schematically explains the configuration of the RTD according to Embodiment 1;

DESCRIPTION OF THE EMBODIMENTS

Figure 1:
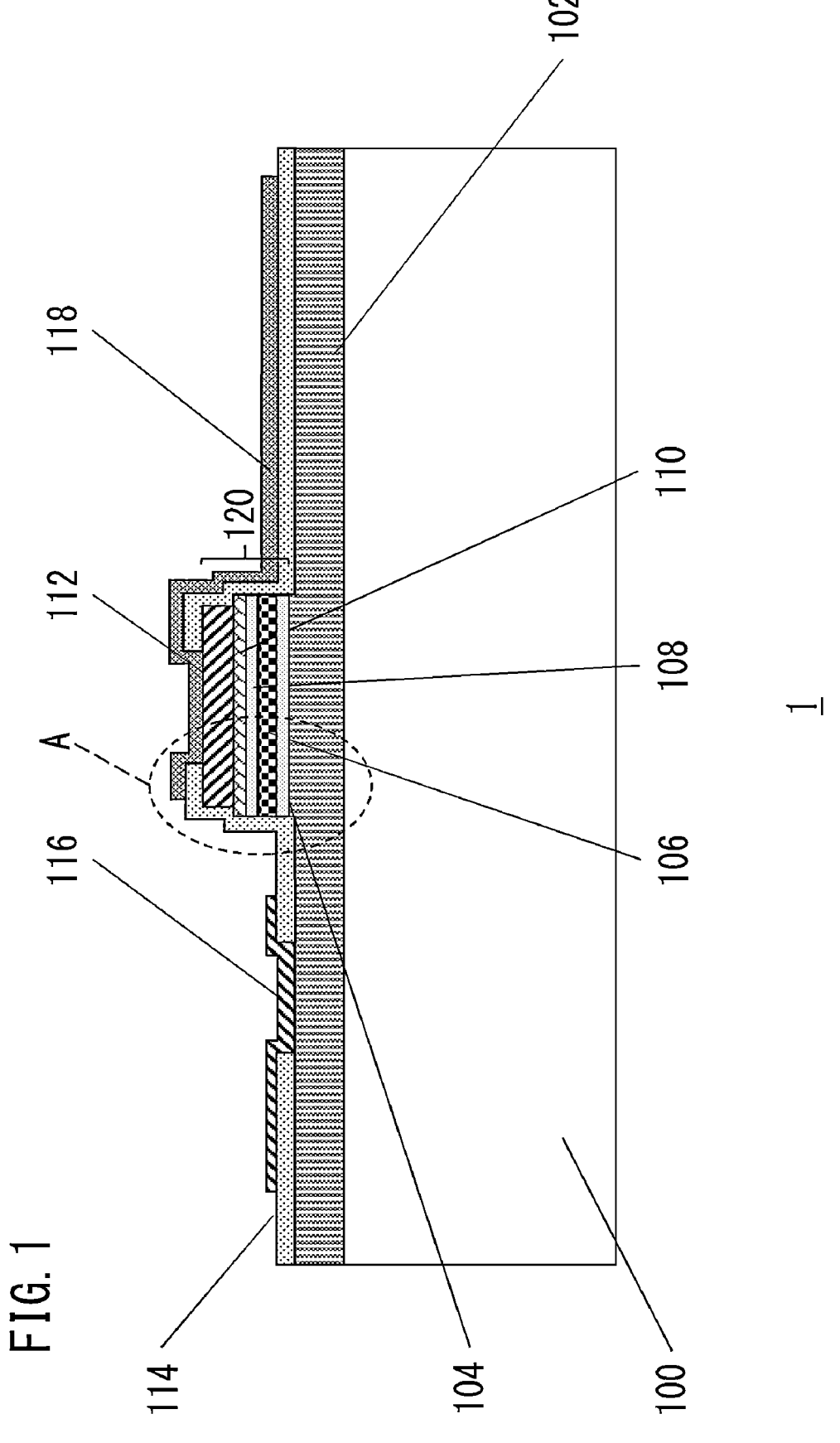
FIG. 1 schematically illustrates the configuration of an RTD according to Embodiment 1.

In order to realize an RTD terahertz oscillator, it is necessary to apply a high current density of the order of $10^5$ A/cm$^2$ to $10^6$ A/cm$^2$ to the RTD. In order to achieve this high current density, it is necessary to process a compound semiconductor epitaxial wafer to form a mesa structure having a multiple barrier structure and a diameter of about 0.5 μm to 5 μm.

The multiple barrier structure can be exemplified by a double barrier structure in which a quantum well layer with a small bandgap is sandwiched between barrier layers with a large bandgap. A mesa structure of this size is typically fabricated using a dry etching method.

The inventors of the present application finds the following points after examination. Firstly, when a compound semiconductor epitaxial layer (compound semiconductor single crystal layer) is processed by a dry etching method, the surface region (a region of several tens of nanometers) of the semiconductor crystal layer left by etching is considerably damaged. This region could have more crystal defects than an undamaged semiconductor crystal layer.

Secondly, a region including many crystal defects could be formed in the outer edge portion of the mesa structure with a diameter of about 0.5 μm to 5 μm, which is formed by dry etching to realize an RTD terahertz oscillator. For this reason, a problem arising when a current is injected into a region including many crystal defects is that the barrier layers and quantum well layers of the multiple barrier structure collapse, the RTD does not exhibit a negative resistance characteristic resulting from the resonant tunneling effect, and current short-circuiting occurs. For example, a high current density of the order of $10^5$ A/cm$^2$ to $10^6$ A/cm$^2$ is applied to the mesa having a diameter of about 0.5 μm to 5 μm, the current short-circuiting could occurs.

Preferred embodiments of the technique of the present disclosure will be described below with reference to the drawings. Each drawing is only described for the purpose of explaining the structure or configuration, and the dimensions of each member shown in the drawing do not necessarily reflect the actual dimensions. In addition, in each figure, the same reference numerals are given to the same members or the same constituent elements, and hereinafter, descriptions of overlapping contents will be omitted. For example, in the following embodiments, a resonant tunneling diode is shown as an example of a semiconductor device to which the present invention can be applied, but the present invention can also be applied to light-emitting devices such as surface emitting lasers and light-emitting diodes.

According to the technique of the present disclosure, when arranging an electrode in contact with a compound semiconductor mesa structure on the mesa structure, a structure is configured in which, by contrast with the structure of the conventional example, a first region including a crystal defect formed in the mesa structure and the electrode are arranged apart from each other. In other words, a configuration is employed in which the outer diameter of the electrode placed in contact with the compound semiconductor mesa structure is smaller than the outer diameter of the upper portion of the compound semiconductor mesa structure. Embodiments of the technique of the present disclosure will be described below.

Embodiment 1

In Embodiment 1, a single resonant tunneling diode (RTD) will be described. FIG. 1 schematically explains the configuration of the RTD in the present embodiment.

FIG. 1 is a schematic cross-sectional view of an RTD 1 according to the present embodiment. As shown in the figure, a lower contact layer ($n^+$-InGaAs) 102 is formed on a semiconductor substrate (InP) 100. A compound semiconductor mesa structure (hereinafter referred to as "mesa structure") 120 is formed on the lower contact layer 102. The mesa structure 120 has a semiconductor layer 130 including a lower spacer layer (n-InGaAs) 104, a double barrier structure (InAs/InGaAs/InAs) 106, an upper spacer layer (n-InGaAs) 108, and an upper contact layer ($n^+$-InGaAs) 110. Thus, the compound semiconductor layer (hereinafter referred to as "semiconductor layer") 130 includes a heterojunction having a double barrier structure as a multiple barrier structure. An upper electrode 112 is arranged above the mesa structure 120 so as to contact the upper surface of the semiconductor layer 130, that is, the upper surface of the upper contact layer 110. Further, a lower electrode 116 is arranged so as to be in contact with the lower contact layer 102. Furthermore, the entire RTD 1 is covered with a passivation film (dielectric film) 114 so that the upper electrode 112 and the lower electrode 116 are exposed. The passivation film 114 is a dielectric film. For example, the passivation film 114 preferably comprises any of silicon nitride, silicon oxide, or aluminum oxide. The passivation film 114 covers an area ranging from at least the first region 200 to at least a part of the upper electrode 112. The first region 200 includes crystal defects, which can be caused by, for example, dry etching. For example, the first region 200 can be a region including a crystal, a region including a crystal defect, a region including an amorphous material, a region including both a crystal and a crystal defect, a region including both a crystal and an amorphous material, a region including both a crystal defect and an amorphous material, or a region including a crystal, an amorphous material, and a crystal defect. Details of the first region 200 will be described hereinbelow. Also, the passivation film 114 may be arranged in the order of the semiconductor substrate 100, the lower contact layer 102, and the passivation film 114 to cover the lower contact layer 102. Also, in the present embodiment, part of the electrode 118 can function as the upper electrode 112. The electrode 118 extends from above the mesa structure 120 to above the passivation film 114.

Figure 2:
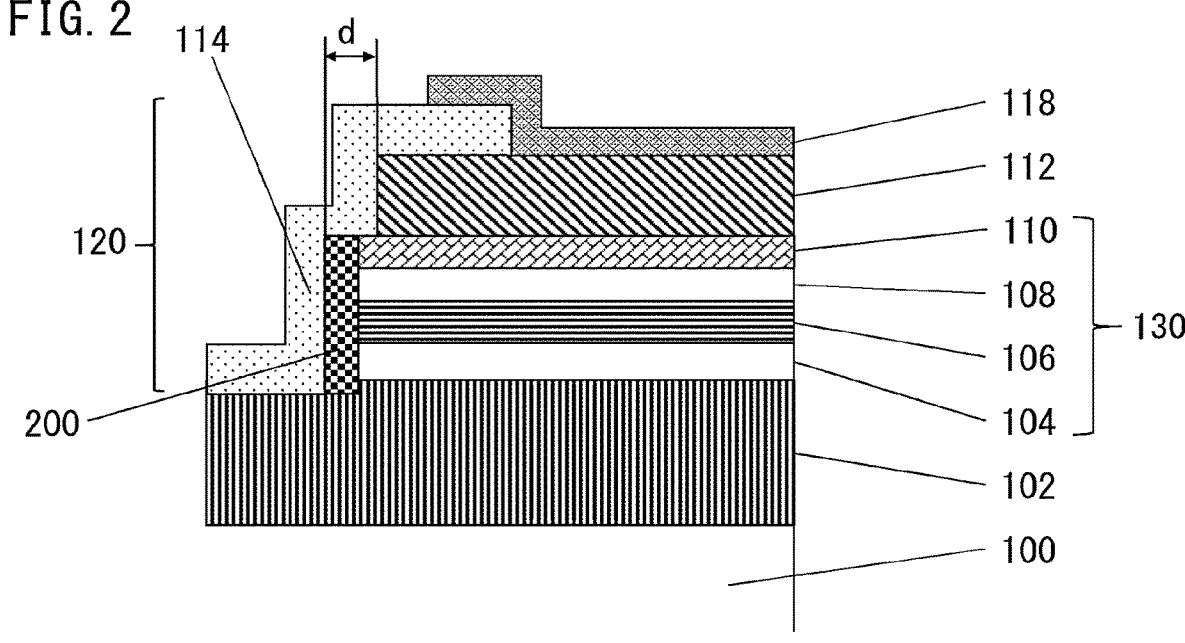
FIG. 2 schematically explains the configuration of an RTD mesa structure side wall according to Embodiment 1.

FIG. 2 is an enlarged view of the portion surrounded by circle A in FIG. 1, and schematically shows the configuration of the outer edge portion of the mesa structure 120 of the RTD 1 in the present embodiment. As shown in FIG. 2, the first region 200 including crystal defects caused by dry etching is generated in the outer edge portion of the semiconductor layer 130 of the mesa structure 120 formed by the dry etching method. The first region 200 including crystal defects caused by dry etching is also generated in the outer edge portion of the double barrier structure 106. Therefore, in the first region 200 including crystal defects caused by dry etching, an energy level called a resonance level is not formed, and a current is more likely to flow than in a first region not including crystal defects (a region in which a resonance level is formed). However, as shown in FIG. 2, the upper electrode 112 and the first region 200 including crystal defects caused by dry etching are arranged apart from each other. Therefore, no current flows through the first region 200 including crystal defects caused by dry etching, and the current flows through the double barrier structure 106 having no crystal defects. As a result, the resonant tunneling effect can be stably obtained with the RTD 1.

For example, a case is assumed in which the mesa structure 120 is formed by dry etching as a mesa structure with a mesa diameter of 1 μm and a mesa height of 0.15 μm in the RTD 1. In this case, it can be considered that the first region 200 including crystal defects caused by dry etching is formed within a region having a thickness of 20 nm from the outer edge of the mesa structure 120 toward the center.

Therefore, in order to prevent current from flowing through the first region 200 including crystal defects caused by dry etching, it is preferable that the arrangement be such that the difference between the outer diameter of the electrode 112 and the outer diameter of the upper portion of the mesa structure 120 is 20 nm or more. That is, as shown in FIG. 2, in a cross section parallel to the thickness direction of the substrate 100 (vertical direction on the paper surface), the outer edge of the upper surface of the mesa structure 120 is arranged at a predetermined distance (distance d in the figure) in a direction perpendicular to the thickness direction of the substrate 100 (in the horizontal direction of the paper surface) from the outer edge of the electrode 112. Here, the predetermined distance is 20 nm or more.

FIG. 3 shows a graph of the voltage-current characteristic of the RTD 1 when the electrode 112 and the first region 200 formed in the mesa structure 120 and including crystal defects caused by dry etching are arranged apart from each other. FIG. 3 also shows a graph of the voltage-current characteristic of the RTD 1 when the electrode 112 and the first region 200 formed in the mesa structure 120 and including crystal defects caused by dry etching are not arranged apart from each other. In FIG. 3, a characteristic curve 300 shows the voltage-current characteristic of the RTD 1 in which the electrode 112 and the first region 200 formed in the mesa structure 120 and including crystal defects caused by dry etching are arranged apart from each other. A characteristic curve 302 shows the voltage-current characteristics of the RTD 1 in a case where it is assumed that the electrode 112 and the first region 200 formed in the mesa structure 120 and including crystal defects caused by dry etching are not arranged apart from each other. Thus, the characteristic curve 300 exhibits negative resistance characteristics due to the resonant tunneling effect. Meanwhile, the characteristic curve 302 shows a so-called short-circuit characteristic in which the resonant tunneling effect is not demonstrated, the current increases as the voltage rises, and the current flows through the first region including crystal defects.

Furthermore, a characteristic curve 304 shows the voltage-current characteristic of the RTD 1 related to the case where it is assumed that the electrode 112 and the first region 200 formed in the mesa structure 120 and including crystal defects caused by dry etching are not arranged apart from each other, this case being different from that of the characteristic curve 302. In the characteristic curve 304, the current abruptly increases at a certain voltage value (in the case shown in the figure, a voltage value between 0.4 V and 0.5 V), and where a voltage is applied to the RTD 1, a short-circuit characteristic similar to the characteristic curve 302 is shown. A case is assumed in which the electrode 112 and the first region 200 including crystal defects caused by dry etching and occurring in the mesa structure 120 and not arranged apart from each other. In this case, an unstable operation occurs, such as the RTD 1 not exhibiting the resonant tunneling effect, or the RTD 1 not exhibiting the resonant tunneling effect when driven continuously. Therefore, with the RTD 1 of the present embodiment, the RTD 1 that operates stably can be obtained by arranging the upper electrode 112 and the first region 200 formed in the semiconductor layer 130 of the mesa structure 120 and including crystal defects caused by dry etching apart from each other.

Figure 4:
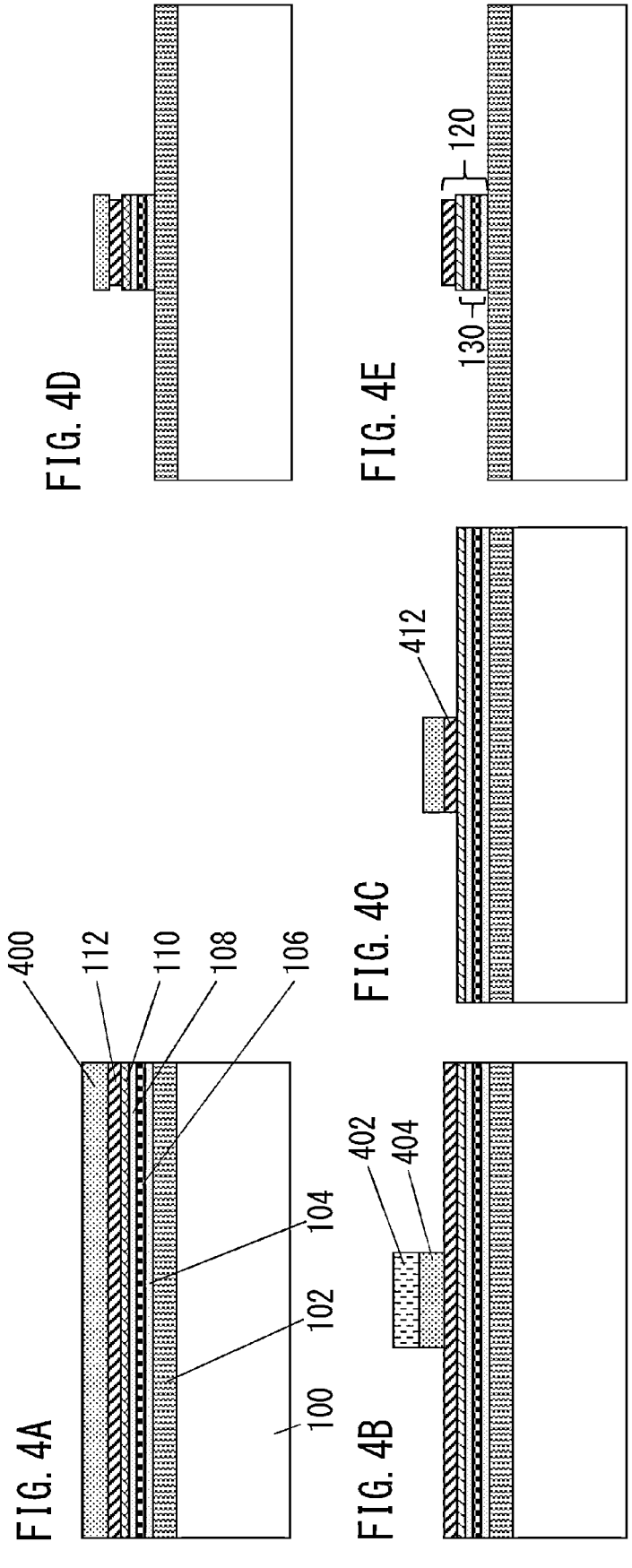
FIGS. 4A to 4E schematically explain methods of manufacturing the RTD mesa structure according to Embodiment 1.

FIGS. 4A to 4E schematically illustrate methods for manufacturing the mesa structure 120 of the RTD 1 according to the present embodiment. As shown in FIG. 4A, first, layers are sequentially formed on an n-type InP substrate 100. The layers formed are an n⁺-type InGaAs lower contact layer 102, an undoped InGaAs spacer layer 104, and an undoped AlAs/InGaAs/AlAs double barrier structure 106. Furthermore, a non-doped InGaAs spacer layer 108 and an n⁺-type InGaAs upper contact layer 110 are formed on the double barrier structure 106. Each layer is formed by epitaxial growth by a molecular beam epitaxy (MBE) method. Each layer may also be formed by epitaxial growth by a metal organic chemical vapor deposition (MOCVD) method or the like. Thereafter, an upper electrode 112 made of a tungsten layer, which is an ohmic electrode material, is formed by sputtering. Subsequently, a silicon oxide layer 400, which serves as a mask during dry etching, is deposited using a plasma enhanced chemical vapor deposition (PECVD) method.

Next, as shown in FIG. 4B, a resist pattern 402 is formed using photolithography, and then the silicon oxide layer 400 is processed by dry etching using a fluorine-based gas. Subsequently, the resist pattern 402 is removed (not shown).

Next, as shown in FIG. 4C, using a processed silicon oxide layer 404 as a mask, the upper electrode 112 is processed by a dry etching method using a fluorine-based gas.

Next, as shown in FIG. 4D, using the processed silicon oxide layer 404 as a mask, the upper contact layer 110, the upper spacer layer 108, the double barrier structure 106, the lower spacer layer 104, and the lower contact layer 102 are processed by dry etching using a chlorine-based gas. At this time, by adjusting the dry etching conditions, side etching occurs on the sidewalls of the processed tungsten layer 412. Specifically, side etching occurs on the side wall of the processed tungsten layer 412 as a result of setting the dry etching condition to promote a chemical reaction between chlorine-based radicals based on the chlorine-based gas and tungsten.

Next, where the processed silicon oxide layer 404 is removed as shown in FIG. 4E, the upper electrode 112 and the center (central axis AX) of the mesa structure 120 are substantially aligned as shown in FIG. 4E. Furthermore, the distance between the outer edge portion of the electrode 112 and the outer edge portion of the mesa structure 120 is 20 nm or more. Thus, the mesa structure 120 is formed in which the upper electrode 112 and the first region 200 containing crystal defects caused by dry etching are set apart from each other.

Figure 5:
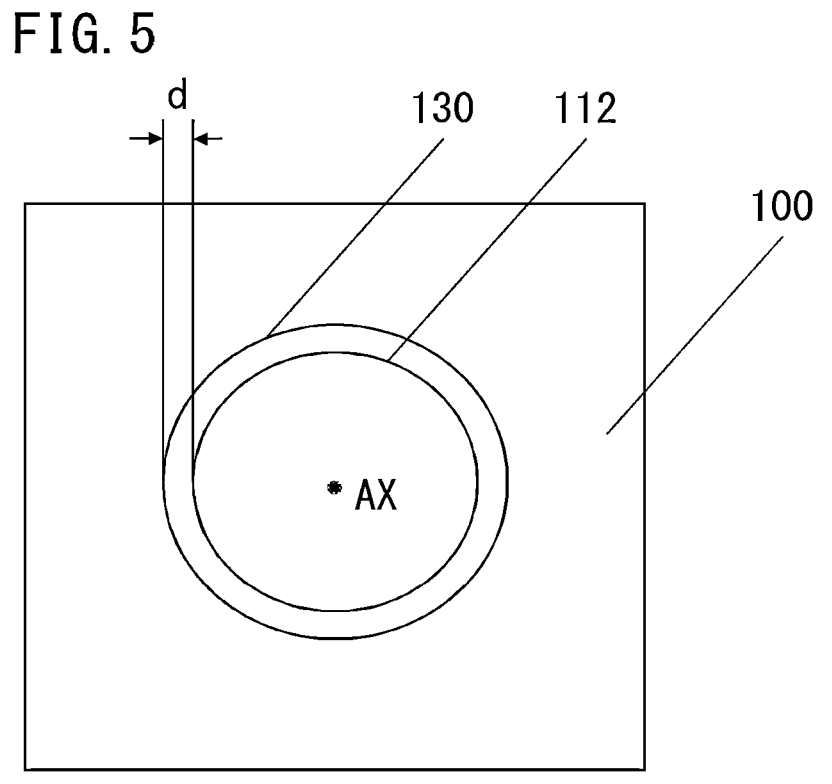

By continuously performing the step explained in FIG. 4C and the step explained in FIG. 4D and using the same processed silicon oxide layer 404, the centers of the upper electrode 112 and the semiconductor layer 130 can be substantially aligned with each other when viewed from the top of the substrate 100. FIG. 5 schematically shows the positional relationship between the upper electrode 112 and the semiconductor layer 130 when viewed from the top of the substrate 100 of the RTD 1. In FIG. 5, components other than the substrate 100, the semiconductor layer 130, and the upper electrode 112 are omitted. As shown in FIG. 5, the centers (central axis AX) of the electrode 112 and the semiconductor layer 130 are substantially aligned when viewed from the top of the substrate 100. By adopting such a configuration in which the central axis of the upper electrode 112 and the center of the semiconductor layer 130 are substantially aligned, a mesa structure in which the outer edge of the electrode 112 and the outer edge of the semiconductor layer 130 are set apart from each other can be formed. As a result, in the RTD 1 of the present embodiment, a high current density of the order of $10^5$ A/cm² to $10^6$ A/cm² can be stably applied to the mesa structure 120.

Also, although not shown in FIGS. 4A to 4E, as a step after forming the mesa structure 120, a silicon nitride layer is deposited as a passivation film (dielectric layer) 114, and then the lower contact layer 102 is exposed. Subsequently, after forming a tungsten layer, the lower electrode 116 is formed using photolithography and dry etching. After that, an opening is formed in the passivation film 114 above the mesa structure 120 using lithography and dry etching to expose the upper electrode 112 made of the tungsten layer. After that, a second Au/Ti electrode (electrode 118 in FIG. 1), which serves as a wiring electrode or pad electrode connected to the upper electrode 112, is formed by lithography, electron beam deposition, and lift-off.

Through the above steps, it is possible to form the RTD 1 shown in FIG. 1. The steps and method for fabricating the RTD described herein are merely an example, and other steps and methods may be employed as long as the above configuration is obtained. In addition, although the InGaAs/InAs-based RTD formed on the InP substrate has been described in the present embodiment, this configuration is not limiting. For example, the above configuration and effect can be obtained with a GaAs/AlGaAs-based RTD formed on a GaAs substrate, a GaN/AlGaN-based RTD formed on a GaN substrate or a Si substrate, and a Si/SiGe-based RTD formed on a Si substrate. Further, in the explanation of the present embodiment, tungsten is used as the upper electrode 112, but this feature is not limiting. For example, the above configuration and effect can be obtained with molybdenum and tantalum.

Therefore, according to the present embodiment, even if a high current density of the order of $10^5$ A/cm² to $10^6$ A/cm² is applied to the mesa having a diameter of about 0.5 μm to 5 μm, the RTD is not short-circuited, and it is possible to provide an RTD capable of stably demonstrating a negative resistance characteristic.

Embodiment 2

Next, the RTD 1 according to Embodiment 2 will be described. In the following explanation, descriptions of the same configurations and processes as those of Embodiment 1 are omitted.

Figure 6:
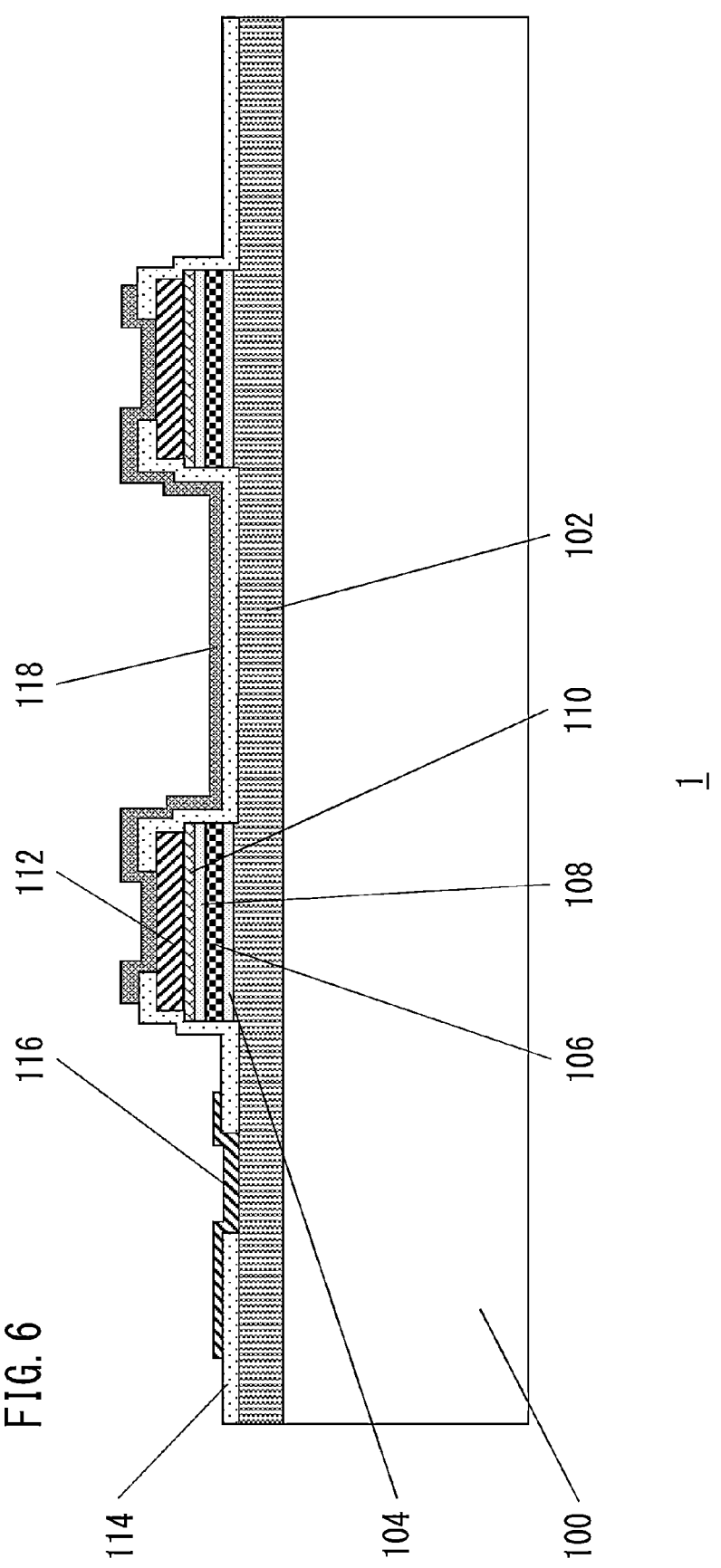
FIG. 6 schematically illustrates the configuration of an RTD according to Embodiment 2 in which two mesa structures are arranged.

The configuration of the RTD 1 in which a single mesa structure 120 is provided on the substrate 100 has been described in Embodiment 1, but an RTD 1 having an RTD array configuration in which a plurality of mesa structures 120 is arranged on the substrate 100 can also be manufactured. FIG. 6 shows a cross-sectional schematic diagram of an RTD 1 in which two mesa structures 120 are arranged. As shown in FIG. 6, in each mesa structure 120 in the array configuration as well, the upper electrode 112 and the first region 200 including crystal defects caused by dry etching are set apart from each other in the same manner as in Embodiment 1. Therefore, the current does not flow through the first region 200, which includes crystal defects caused by dry etching and in which the current is likely to flow, and the current flows through the region including the double barrier structure 106 without crystal defects. As a result, the RTD 1 of the present embodiment also can stably exhibit the resonant tunneling effect as in Embodiment 1. The RTD 1 can be manufactured according to the manufacturing method described in Embodiment 1.

Embodiment 3

An oscillator can be configured by connecting the RTD 1 described in Embodiment 1 to an external resonator. Therefore, in Embodiment 3, a resonant tunneling diode (RTD) terahertz oscillator is described in which one RTD and a patch antenna (microstrip antenna) as an external resonator are connected and integrated to configure a small-sized solid-state element structure.

Figure 7:
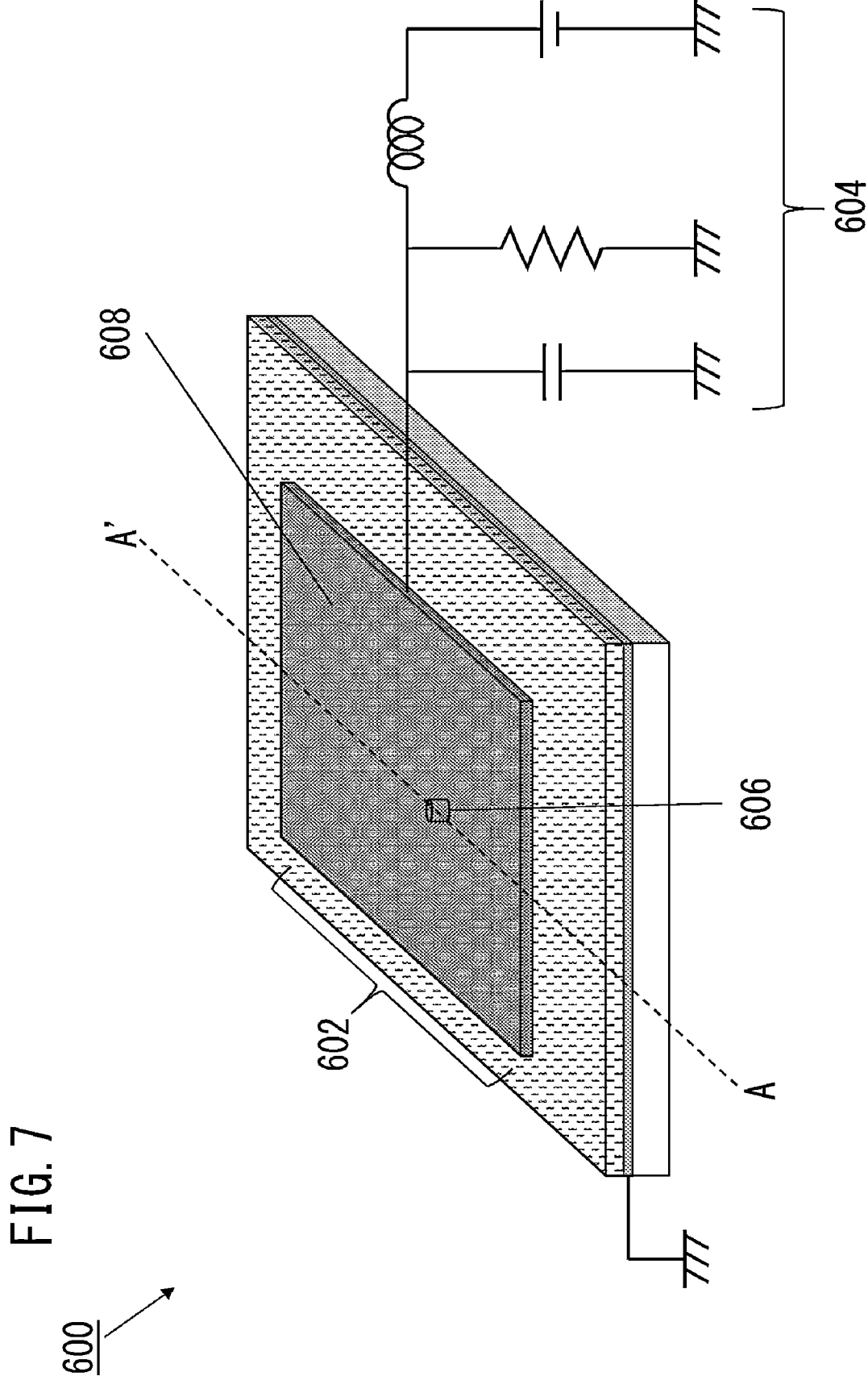
FIG. 7 is a schematic perspective view illustrating the configuration of an RTD terahertz oscillator according to Embodiment 3.
Figure 8:
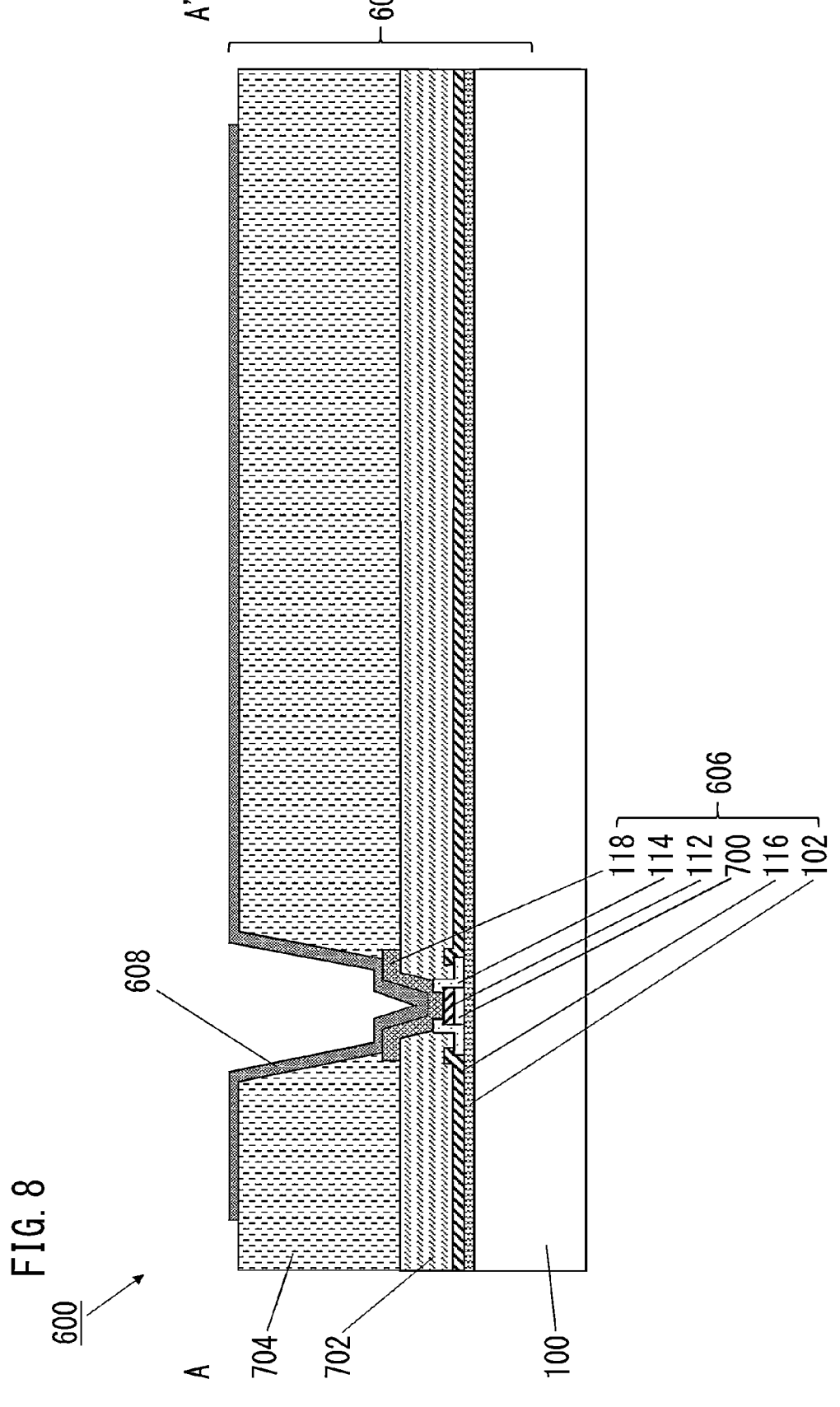
FIG. 8 is a schematic cross-sectional view for explaining the configuration of the RTD terahertz oscillator according to Embodiment 3.

FIG. 7 is a schematic perspective view illustrating the configuration of the RTD terahertz oscillator according to the present embodiment, and FIG. 8 is a schematic cross-sectional view thereof, which is a cross-sectional view taken along line A-A' in FIG. 8.

The configuration of an RTD terahertz oscillator 600 will be described hereinbelow with reference to FIG. 7. The RTD terahertz oscillator 600 has a resonator 602 for generating a terahertz wave and a bias circuit 604 as main components. The resonator 602 also includes an RTD 606 and a patch antenna 608.

Next, the resonator 602 will be explained using FIG. 8. The resonator 602 is configured of the semiconductor substrate 100, the lower contact layer 102, a semiconductor layer 700, the first upper electrode 112, the first dielectric layer 114, the lower electrode 116, a second dielectric layer 702, the second upper electrode 118, a third dielectric layer 704, and the patch antenna 608. The semiconductor layer 700 includes the lower spacer layer 104, the double barrier structure 106, the upper spacer layer 108, and the upper contact layer 110 shown in FIG. 1. The arrangement of these layers constituting the semiconductor layer 700 is the same as that shown in FIG. 2. Also, the patch antenna 608 corresponds to the third upper electrode.

Further, the RTD 606 comprises the lower contact layer 102, the semiconductor layer 700, the first upper electrode 112, the first dielectric layer 114, the lower electrode 116, and the second upper electrode 118. The mesa structure of the RTD 606 is configured of the semiconductor layer 700 and the first upper electrode 112, and in this mesa structure, the outer edge of the first region 200 including crystal defects caused by dry etching in the semiconductor layer 700 and the outer edge of the upper electrode 112 are arranged at a predetermined distance from each other, in the same manner as in FIG. 2. As a result of employing the above configuration in the RTD 606 according to the present embodiment, the RTD terahertz oscillator 600 has a gain in the terahertz wave frequency band.

Further, the resonator 602 is configured such that the two conductors of the lower electrode 116 and the third upper electrode 608 sandwich the second dielectric layer 702 and the third dielectric layer 704. Such a configuration is known as a microstrip type resonator. Therefore, in the present embodiment, a case where the patch antenna 608, which is a typical microstrip resonator, is used will be described.

The lower electrode 116 is formed on the lower contact layer 102 formed on the semiconductor substrate 100. Further, the semiconductor layer 700 formed on the lower contact layer 102 is electrically connected through the first upper electrode 112, the second upper electrode 118 and the third upper electrode (patch antenna) 608. From the viewpoint of suppressing loss, that is, increasing output and suppressing parasitic oscillation, it is preferable that low-resistance ohmic connection be realized for the lower electrode 116, which is connected to the lower contact layer 102, and the first upper electrode 112, which is connected to the semiconductor layer 700 (upper contact layer 110). In Embodiment 1, it has been assumed that the nttype InGaAs lower contact layer and the nttype InGaAs upper contact layer are used. Therefore, preferably, the lower electrode 102 and the upper electrode 112 comprise Au (gold) and Ti (titanium), Au and Pd (palladium) and Ti, Au and Pt (platinum) and Ti, W (tungsten), Mo (molybdenum), or Ta (tantalum). The RTD 1 is formed by using the upper electrode 112 configured as described above and using the manufacturing method described in Embodiment 1 for the mesa structure. As a result, the mesa structure 120 can be formed such that the first region including crystal defects caused by dry etching in the semiconductor layer 700 and the upper electrode 112 are set apart from each other. In order to obtain an oscillator in the terahertz band, it is preferable that the mesa structure 120 of the RTD 606 have a cylindrical structure with a diameter of about 0.5 μm to 5 μm.

In the present embodiment, three dielectrics are used from the following viewpoints.

The first dielectric layer 114 and the second dielectric layer 702 are preferably formed using an inorganic dielectric material such as silicon nitride, silicon oxide, or aluminum oxide from the viewpoint of insulation, barrier properties (electrode metal diffusion prevention), and submicron processability. By using such materials for the first dielectric layer 114 and the second dielectric 702, miniaturization and high current density of the RTD 606 can be achieved. As a result, in the RTD 606, the output and frequency of the RTD terahertz resonator 600 can be increased. The reason why the first dielectric and the second dielectric are separated is to form the lower electrode 116 on the lower contact layer 102.

From the viewpoint of radiation efficiency of the patch antenna 608, the third dielectric layer 704 preferably has a thick configuration. However, where the third dielectric layer 704 is too thick, multimode resonance may occur, so the thickness is preferably λ/10 (λ: effective wavelength of 0-order mode terahertz wave) or less. Further, from the viewpoint of impedance matching with the space (atmosphere), a material with a small dielectric constant is preferable. From the above viewpoint, the third dielectric layer 704 is preferably made of a material having a lower dielectric constant than the material of the second dielectric layer, and is preferably an organic dielectric material as BCB (benzocyclobutene) or a polyimide which are materials having high processability in a semiconductor processing process.

Further, in the patch antenna 608, the length (width) of the patch antenna 608 in the AA' direction (resonance direction) shown in FIGS. 7 and 8 is set such as to obtain a λ/2 resonator (λ: effective wavelength of 0-order mode terahertz wave).

For example, in the case of an oscillator with a frequency of 0.45 terahertz, the patch antenna 608 is preferably a 170 μm square (when the effective wavelength is 340 μm). In addition, from the viewpoint of suppressing multimode oscillation, the RTD 606 is preferably arranged at a position shifted by 34 μm (when the effective wavelength is 340 μm) in the resonance direction (AA' direction) from the center of gravity (center) of the patch antenna 608 when viewed from the top of the substrate 100.

In the present embodiment, the patch antenna 608 is connected to the RTD 606 through the second upper electrode 118, but the patch antenna 608 and the RTD 606 may be directly connected, rather than through the second upper electrode 118. However, from the viewpoint of processing stability or power supply stability to the RTD 606, it is preferable that the second upper electrode be formed on the second dielectric 702 made of an inorganic material, and then the third dielectric 704 made of an organic material be formed. The patch antenna (third upper electrode) 608 is thus configured.

In the present embodiment, the RTD 606 is supplied with power via the patch antenna (third upper electrode) 608, but this feature is not limiting, and a power supply line may be formed on the second dielectric layer 702. In addition, in the present embodiment, the patch antenna is used as an antenna, but such feature is not limiting, and a slot antenna, a throttle ring antenna, a tapered slot antenna, a ring antenna, or the like may be configured.

By adopting the above configuration, it is possible to obtain an RTD that can stably demonstrate a negative resistance characteristic without short-circuiting in the characteristics of the resonant tunneling diode even when a high current density of the order of $10^5$ A/cm$^2$ to $10^6$ A/cm$^2$ is applied to a mesa with a diameter of about 0.5 μm to 5 μm. Therefore, in the present embodiment, it is also possible to provide a small-sized single-solid-state RTD terahertz oscillator that operates stably.

Embodiment 4

Figure 9:
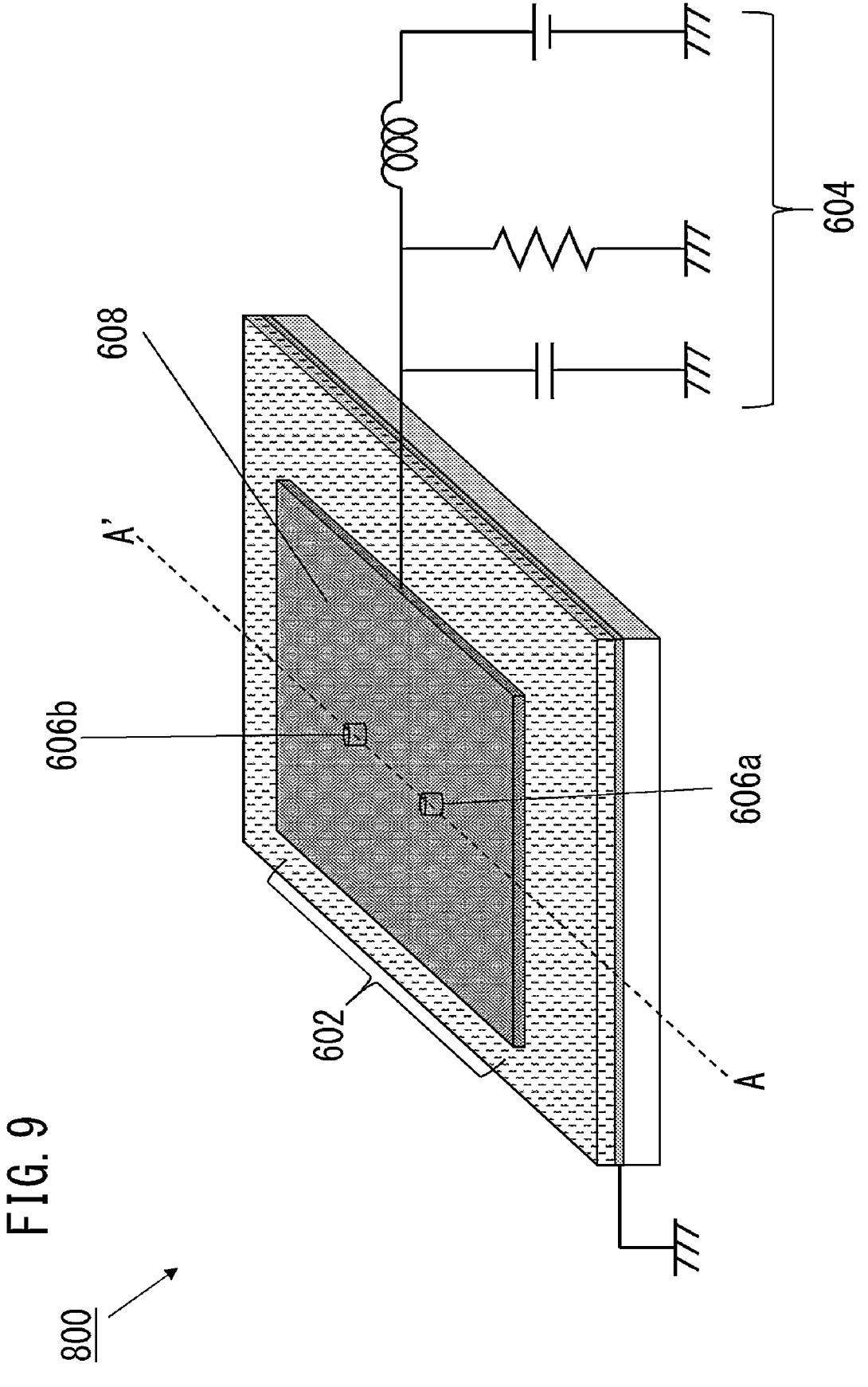
FIG. 9 is a schematic perspective view illustrating the configuration of the RTD terahertz oscillator according to Embodiment 4.
Figure 10:
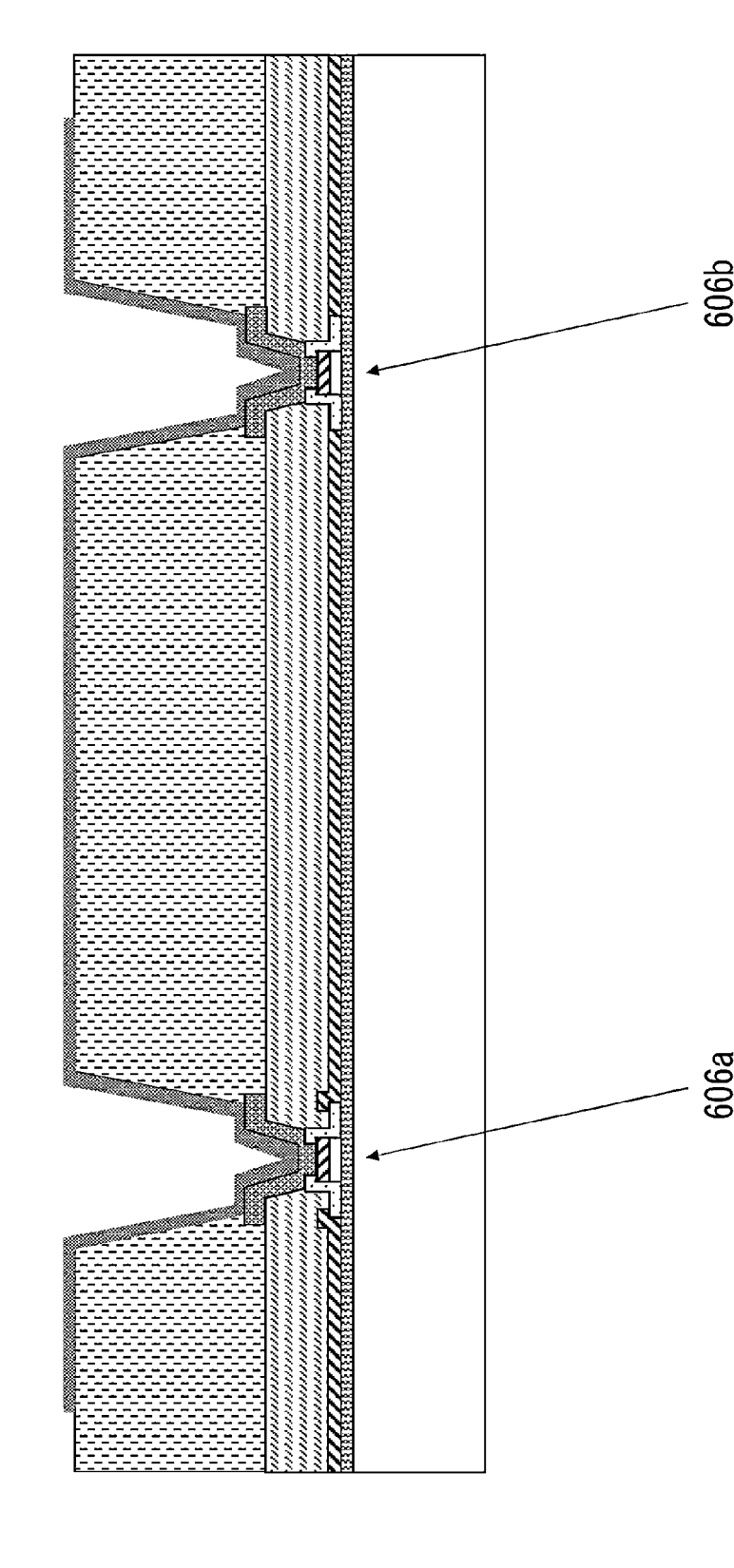
FIG. 10 is a schematic cross-sectional view for explaining the configuration of the RTD terahertz oscillator according to Embodiment 4.

In Embodiment 3, the RTD terahertz oscillator 600 having one RTD 606 has been described, but an oscillator can also be configured by connecting a plurality of RTDs described in Embodiment 2 to an external resonator. Accordingly, in Embodiment 4, an RTD terahertz oscillator 800 including two RTDs 606 will be described with reference to FIGS. 9 and 10. FIG. 9 is a schematic perspective view illustrating the configuration of the RTD terahertz oscillator according to the present embodiment, and FIG. 10 is a schematic cross-sectional view thereof, which is a cross-sectional view taken along line A-A' in FIG. 9. Where the number of RTDs 606 is increased, as in the present embodiment, the current flowing through the resonator 602 can be increased, and the output of the oscillator can be increased.

The configuration of the RTD terahertz oscillator 800 having a plurality of RTDs 606 in the present embodiment is basically the same as in Embodiment 3, but the positional relationship between the RTDs 606 and the patch antenna 608 is different from that in Embodiment 3. Specifically, for example, in the case of an oscillator with a frequency of 0.45 terahertz, the patch antenna 608 is assumed to be a 170 μm square (when the effective wavelength is 340 μm). In this case, from the viewpoint of radiation efficiency and suppression of multimode oscillation, it is preferable to arrange two RTDs 606a and 606b at positions shifted by 34 μm in the resonance direction (AA' direction) from the center of gravity of the antenna when viewed from the top of the substrate 100. In this case, the distance between the two RTDs 606a and 606b is 68 μm and the effective wavelength is 340 μm. By arranging the RTDs 606a and 606b in such a manner, the RTDs 606a and 606b are in a phase-inverted state and oscillate in mutual injection synchronization. As described above, the oscillator according to the present embodiment has a plurality of oscillators according to Embodiment 3, and the plurality of oscillators are coupled to operate in synchronization with each other.

In the present embodiment, the patch antenna is used as an antenna, but such feature is not limiting, and a slot antenna, a throttle ring antenna, a tapered slot antenna, a ring antenna, or the like may be configured.

By adopting the above configuration, it is possible to obtain an RTD that can stably demonstrate a negative resistance characteristic without short-circuiting in the characteristics of the resonant tunneling diode even when a high current density of the order of $10^5$ A/cm$^2$ to $10^6$ A/cm$^2$ is applied to a mesa with a diameter of about 0.5 μm to 5 μm. Therefore, in the present embodiment, it is also possible to provide a small-sized and high-output RTD terahertz oscillator that operates stably and has a single solid-state element structure.

Further, by configuring an array resonator in which the resonators 602 shown in FIG. 8 are arranged in an array (for example, 6×6=36), it is possible to realize an RTD array terahertz oscillator having a higher output. By coupling a plurality of RTD terahertz resonators constituting an array resonator via a microstrip line, the RTDs can oscillate with mutual injection synchronization.

Embodiment 5

Figure 11:
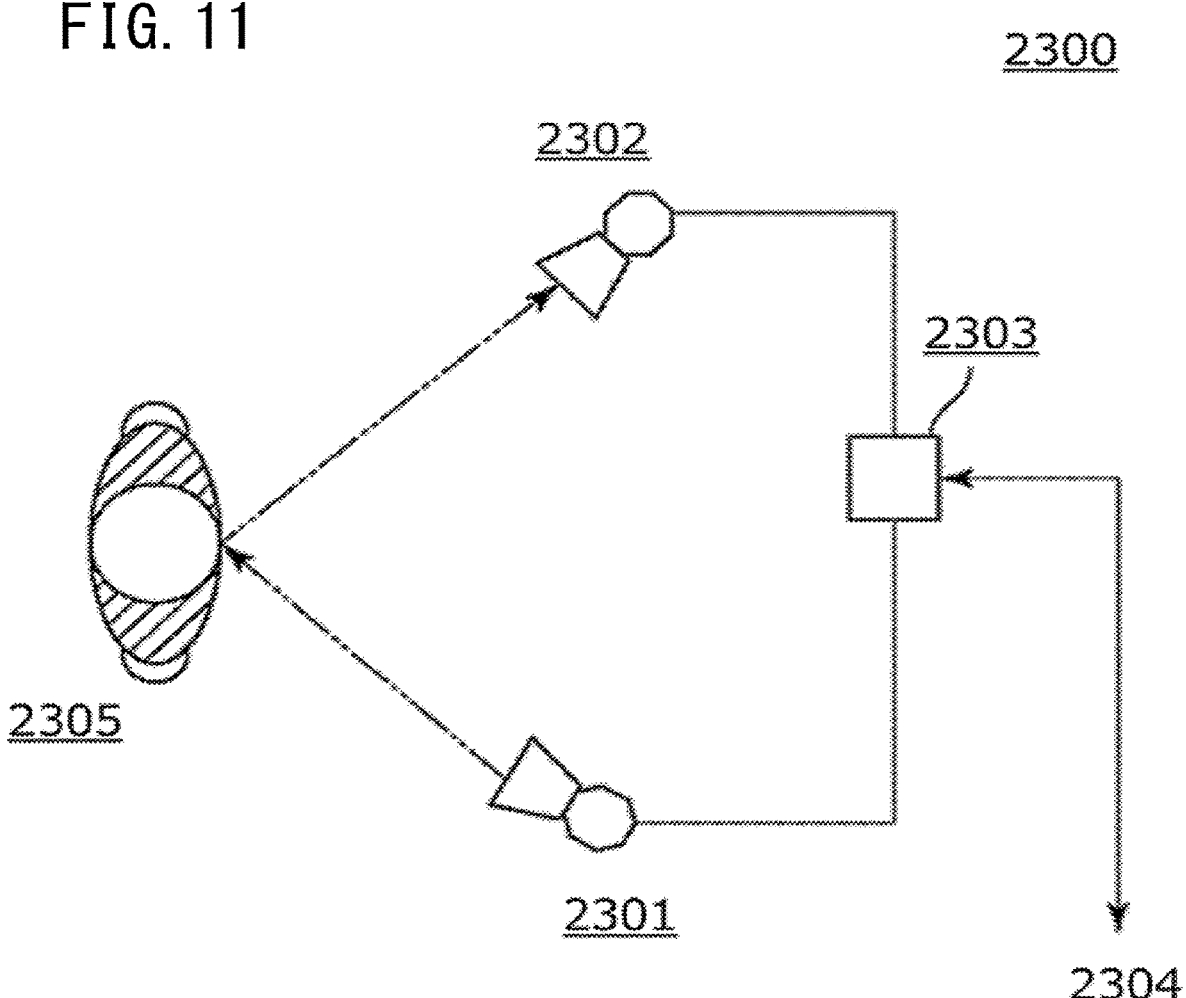
FIG. 11 schematically explains the configuration of the detection system according to Embodiment 5.

The RTDs described in the above embodiments can be adopted in, for example, a detection system. Accordingly, the detection system according to the present embodiment will be described with reference to FIG. 11. The detection system may be a system capable of capturing images, for example a camera system. In the present embodiment, a camera system will be described as an example. FIG. 11 is a schematic diagram for explaining the configuration of a camera system 2300 using terahertz waves.

The camera system 2300 has an oscillation device 2301, a detection device 2302 and a processing unit 2303. In the oscillation device 2301, the RTD described in each embodiment can be used as an oscillation element. The detection device 2302 has a receiving element that receives the high-frequency terahertz waves transmitted from the oscillation device 2301. In this way, the detection device 2302 can detect electromagnetic waves transmitted from an antenna device, and may be, for example, an antenna device using other semiconductor elements such as a Schottky barrier diode. The terahertz wave transmitted from the oscillation device 2301 is reflected by an object 2305 and detected by the detection device 2302. The processing unit 2303 has a processing circuit that processes the signal detected by the detection device 2302. Image data generated by the processing unit 2303 are output from an output unit 2304. With such a configuration, the camera system 2300 can acquire terahertz images.

The oscillation device 2301 or the detection device 2302 may be provided with an optical section having a lens through which terahertz waves can pass. The optical section includes at least one material transparent to terahertz waves, such as polyethylene, Teflon (registered trademark), high-resistance silicon, and a polyolefin resin, and may be composed of multiple layers.

The camera system described in the present embodiment is merely an example, and may be in other forms. In particular, the information acquired by the system is not limited to image information, and the detection system may detect signals.

According to the technique of the present disclosure, it is possible to provide a resonant tunneling diode that can stably operate without short-circuiting in the characteristics of the resonant tunneling diode during current application.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-012278, filed on Jan. 28, 2022, which is hereby incorporated by reference herein in its entirety.

What is claimed is:

1. A resonant tunneling diode comprising:
   a substrate;
   a mesa structure including a compound semiconductor layer including a heterojunction comprising a multi-barrier structure disposed on the substrate;
   an electrode disposed on an upper surface of the compound semiconductor layer, and configured to contact the upper surface of the compound semiconductor layer; and
   a dielectric film,
   wherein an outer edge portion of the compound semiconductor layer is a first region including crystal defects,
   wherein the first region and the electrode are set apart from each other, and
   wherein the dielectric film covers an area ranging from at least a part of the first region to at least a part of the electrode, and covers an upper surface of the part of the electrode.

2. The resonant tunneling diode according to claim 1, wherein in a cross section parallel to a thickness direction of the substrate, an outer edge of the upper surface of the compound semiconductor layer is separated from an outer edge of the electrode by a predetermined distance in a direction perpendicular to the thickness direction of the substrate.

3. The resonant tunneling diode of claim 2, wherein the predetermined distance is 20 nm or more.

4. The resonant tunneling diode of claim 1, wherein a center of the electrode and a center of the compound semiconductor layer are substantially aligned in a top view of the substrate.

5. The resonant tunneling diode of claim 1, wherein the dielectric film covers an area ranging at least from the first region to the electrode.

6. The resonant tunneling diode of claim 1, wherein the dielectric film includes silicon nitride, silicon oxide, or aluminum oxide.

7. The resonant tunneling diode of claim 1, wherein the electrode comprises gold and titanium, gold and palladium and titanium, gold and platinum and titanium, tungsten, molybdenum, or tantalum.

8. The resonant tunneling diode of claim 1, wherein the first region includes crystal defects caused by dry etching.

9. The resonant tunneling diode of claim 1, wherein the first region is a region including a crystal, an amorphous material, or both a crystal and an amorphous material.

10. An oscillator, comprising:
    one or a plurality of resonant tunneling diodes according to claim 1,
    wherein the one or the plurality of resonant tunneling diodes are connected to and integrated with an antenna to form a single solid-state element structure.

11. An oscillator, comprising:
    a plurality of oscillators according to claim 10,
    wherein the plurality of oscillators are coupled and operate in synchronization with each other.

12. A detection system comprising:
    the resonant tunneling diode according to claim 1 as an oscillation element;
    a receiving element that receives a high frequency from the oscillation element; and
    a processing circuit that processes a signal from the receiving element.

13. The resonant tunneling diode of claim 1, further comprising a second electrode.

14. The resonant tunneling diode of claim 13, wherein the second electrode is arranged on the dielectric film.

15. The resonant tunneling diode of claim 14, wherein the dielectric film has an opening, and the second electrode is arranged in the opening.

* * * * *